(12) United States Patent
Heuser et al.

(10) Patent No.: US 9,490,438 B2
(45) Date of Patent: Nov. 8, 2016

(54) OPTOELECTRONIC COMPONENT AND USE OF A COPPER COMPLEX IN A CHARGE GENERATION LAYER SEQUENCE

(75) Inventors: Karsten Heuser, Erlangen (DE); Arndt Jaeger, Regensburg (DE); Ulrich Niedermeier, Leiblfing (DE); Carola Diez, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 744 days.

(21) Appl. No.: 13/993,649

(22) PCT Filed: Nov. 23, 2011

(86) PCT No.: PCT/EP2011/070833
§ 371 (c)(1),
(2), (4) Date: Sep. 19, 2013

(87) PCT Pub. No.: WO2012/079943
PCT Pub. Date: Jun. 21, 2012

(65) Prior Publication Data
US 2014/0008623 A1    Jan. 9, 2014

(30) Foreign Application Priority Data
Dec. 13, 2010  (DE) .................... 10 2010 062 954

(51) Int. Cl.
*H01L 51/00* (2006.01)
*H01L 51/50* (2006.01)

(52) U.S. Cl.
CPC ....... *H01L 51/0091* (2013.01); *H01L 51/5036* (2013.01); *H01L 51/0059* (2013.01)

(58) Field of Classification Search
CPC ................................................ H01L 51/0091
See application file for complete search history.

(56) References Cited

U.S. PATENT DOCUMENTS

| | | | |
|---|---|---|---|
| 6,242,115 B1 | 6/2001 | Thomson et al. | |
| 7,282,696 B2 | 10/2007 | Matsuyama et al. | |
| 7,361,414 B2 | 4/2008 | Tsuboyama et al. | |
| 7,781,073 B2 | 8/2010 | Kijima | |
| 7,858,208 B2 | 12/2010 | Vogler et al. | |
| 8,080,934 B2 | 12/2011 | Kido et al. | |
| 8,278,652 B2 | 10/2012 | Krause et al. | |
| 2005/0260421 A1 | 11/2005 | Wielstra et al. | |
| 2005/0260451 A1 | 11/2005 | Kijima | |
| 2006/0158104 A1 | 7/2006 | Iijima et al. | |
| 2011/0089408 A1* | 4/2011 | Schmid .................. | C07F 1/005 257/40 |

FOREIGN PATENT DOCUMENTS

| | | |
|---|---|---|
| CN | 101730945 | 6/2010 |
| DE | 102004010954 A1 | 10/2005 |
| EP | 1351558 A1 | 10/2003 |
| EP | 1983805 A1 | 10/2008 |
| JP | 2003272860 A | 9/2003 |
| JP | 2003332074 A | 11/2003 |
| JP | 2005339823 A | 12/2005 |
| JP | 2006172762 A | 6/2006 |
| KR | 1020060047931 A | 5/2006 |
| KR | 1020070054729 A | 5/2007 |
| WO | WO2011033023 A1 | 3/2011 |

OTHER PUBLICATIONS

Hamwi (Advanced Functional Materials, 20(11) (2010) 1762-1766).*
Sevryugina, Yulia et al., Breaking Infinite Cu I Carboxylate Helix Helix Held by Cuprophilicity into Discrete Cu n Fragments (n=6, 4,2), Full Paper, Wiley-VCH Verlag GmbH & Co., KGaA, Eur. J. Inorg. Chem., www.eurjic.org, pp. 219-229, Nov. 27, 2007.
Kroeger, M., et al., "Temperature-independent field-induced charge separation at doped organic/organic interfaces: Experimental modeling of electrical properties," Physical Review B, vol. 75, 2007, 8 pages.
Lee, T-W., et al., "High-efficiency stacked white organic light-emitting diodes," Applied Physics Letters, vol. 92, 2008, 4 pages.
Meerheim, R., et al., "Ultrastable and efficient red organic light emitting diodes with doped transport layers," Applied Physics Letters, vol. 89, 2006, 3 pages.
Sevryugina, Y., et al., "Tetranuclear copper(I) clusters: impact of bridging carboxylate ligands on solid state structure and photoluminescence," Journal of Chemical Communication, No. 37, 2007, pp. 3853-3855.
Sevryugina, Y., et al., "X-ray structure and photoluminescence of copper(I) 2,6-bis(trifluoromethyl)benzoate," Inorganica Chemica Acta, No. 360, 2007, 3103-3107.
Sharma, R., et al., "Segregated aromatic π- π stacking interactions involving fluorinated and non-fluorinated benzene rings: Cu(py)2(pfb)2 and Cu(py)2(pfb)2(H2O) (py=pyridine and pfb=pentafluorobenzoate)," Journal of Fluorine Chemistry, No. 131, 2010, pp. 456-460.

* cited by examiner

*Primary Examiner* — Kuo-Liang Peng
(74) *Attorney, Agent, or Firm* — Slater Matsil, LLP (57) ABSTRACT

Different embodiments of the optoelectronic component have an organic layer structure for isolating charge carriers of a first charge carrier type and charge carriers of a second charge carrier type. The organic layer structure comprises a copper complex which has at least one ligand with the chemical structure as per a formula (I). In this formula, E1 and E2 are each one of the following elements independently of one another: oxygen, sulphur or selenium. R is chosen from the group comprising: hydrogen or substituted or unsubstituted, branched, linear or cyclic hydrocarbons.

20 Claims, 4 Drawing Sheets

OPTOELECTRONIC COMPONENT AND USE OF A COPPER COMPLEX IN A CHARGE GENERATION LAYER SEQUENCE

This patent application is a national phase filing under section 371 of PCT/EP2011/070833, filed Nov. 23, 2011, which claims the priority of German patent application 10 2010 062 954.5, filed Dec. 13, 2010, each of which is incorporated herein by reference in its entirety.

TECHNICAL FIELD

The present invention relates to an optoelectronic component; more particularly it relates to an optoelectronic component having a charge generation layer, and also to the use of a copper complex in a charge generation layer sequence of an electronic component.

BACKGROUND

An optoelectronic component is designed for converting electrical energy into electromagnetic radiation, such as into visible light, for example, or for the reverse process. Reference may be made in each case to an emitter device or a detector device. One example of an electromagnetic component as an emitter device is a light-emitting device, more particularly, a light-emitting diode (LED). The device typically comprises electrodes with an active zone disposed between them. Via the electrodes, the light-emitting device can be supplied with an electric current which in the active zone is converted into optical energy, i.e., electromagnetic radiation. The optical energy is outcoupled from the light-emitting device via a radiation outcoupling area.

One particular light-emitting device is the organic light-emitting diode (OLED). An OLED has an organic layer in the active layer to convert electrical energy into electromagnetic radiation. When the OLED is contacted, via the electrodes, with a current source, different types of charge carrier are injected into the organic layer. Positive charge carriers, also referred to as holes, migrate from the anode toward the cathode through the organic layer, while electrons migrate through the organic layer from the cathode toward the anode. This gives rise to the formation in the organic layer of states of excitation in the form of electron-hole pairs, known as excitons, which decompose with emission of electromagnetic radiation.

A further example of an optoelectronic component is the detector device, in which optical radiation is converted into an electrical signal or into electrical energy. An example of an optoelectronic component of this kind is a photodetector or a solar cell. A detector device, too, has an active layer disposed between electrodes. The detector device has a radiation entry side, via which electromagnetic radiation—for example, light, infrared radiation, or ultraviolet radiation—enters the detector device and is guided to the active layer. In the active layer, with exposure to the radiation, an exciton is excited, and in an electrical field is divided into an electron and a hole. In this way, an electrical signal or electrical charge is generated and is provided to the electrodes.

SUMMARY OF THE INVENTION

In all cases, high efficiency is desirable in the conversion of electrical energy into electromagnetic radiation or for the reverse process. The problem on which the present invention is based is that of providing an optoelectronic component with high efficiency.

This problem is solved by an optoelectronic component and by the use of a copper complex.

The various configurations of the embodiments described below apply equally, where they can be employed analogously, to the electronic component and to the use of the copper complex in an organic layer structure.

Different embodiments of the optoelectronic component have an organic layer structure for separating charge carriers of a first charge carrier type and charge carriers of a second charge carrier type. The organic layer structure has a copper complex with at least one ligand with the chemical structure according to formula I:

(I)

$E_1$ and $E_2$ are in each case independently of one another one of the following elements: oxygen, sulfur, or selenium. R is selected from the following group: hydrogen, or substituted or unsubstituted, branched, linear, or cyclic hydrocarbons.

This organic layer structure is adapted to separate charge carriers of a first charge carrier type from charge carriers of a second charge carrier type. For example, the charge carriers of the first charge carrier type are holes, and the charge carriers of the second charge carrier type are electrons. One example of a layer structure of this kind is a charge generation layer sequence or "charge generation layer" (CGL).

A charge generation layer sequence of this type has a p-doped layer which comprises the above-identified copper complex as a p-dopant. The p-doped layer may be connected via a potential barrier—in the form, for example, of a boundary layer or of an insulating interlayer—to an n-doped layer. The copper complex has a very good doping capacity. It improves charge carrier transport in the charge generation layer; in particular, the conductivity of holes is increased in the p-doped region. As a result of the high conductivity and doping capacities, strong band bending can be achieved in the p-doped layer in the vicinity of the potential barrier. Tunnel processes of charge carriers through the potential barrier can be improved in this way. As a result of the high conductivity, charge carriers transferred through a tunnel process are easily transported from the charge generation layer sequence. In this way, overall, the charge generation layer sequence is able to provide a high number of freely mobile charge carriers, thus producing particularly high efficiency of the optoelectronic component.

A further advantage of using copper complexes is the ready-availability of the starting materials and the unhazardous processing of the dopants, thereby allowing utilization of a cost-effective and eco-friendly alternative to existing dopants.

In certain embodiments the copper complex is a copper(I) pentafluorobenzoate. The structure of this complex is as follows:

where positions 2 to 6 are occupied by fluorination. The selection of the copper(I) pentafluorobenzoate is especially advantageous because this complex is associated with high hole conductivity and low absorption in the visible spectral range. For a layer 100 nm thick of (4,4',4"-tris(N-(1-naphthyl)-N-phenylamino)triphenylamine which has been doped with copper(I) pentafluorobenzoate, a transmission of more than 93% has been measured above a wavelength of 420 nm.

Copper(I) pentafluorobenzoate is particularly suitable, furthermore, for processing when fabricating an optoelectronic component. It has a vaporization temperature of only around 200° C. Other dopants used for p-doping, such as $V_2O_5$, $MoO_3$, $WO_3$, or F4-TCNQ (2,3,5,6-tetrafluoro-7,7,8,8-tetracyanoquinodimethane), have a substantially higher vaporization temperature. Copper(I) pentafluorobenzoate can therefore be processed without the use of special high-temperature vaporization sources.

In certain embodiments the p-doped organic semiconductor layer has a doping gradient toward the n-doped organic semiconductor layer. This means that the concentration of the dopant changes over the cross section of the p-doped organic semiconductor layer. The doping of the p-doped organic semiconductor layer advantageously increases toward the n-doped organic semiconductor layer. This increases mobility of holes in the p-doped organic semiconductor layer specifically in the region of the interface of the n-doped organic semiconductor layer and/or of the interlayer. This is especially advantageous for efferent transport of charge carriers in this region. In this way it is possible, additionally, for a potential barrier at the interface and/or interlayer to be formed with particular efficiency. A doping gradient can be obtained in this case, for example, by the application of a plurality of p-doped organic semiconductor layers one above another. It is also conceivable for the supply of the dopant to be altered by a suitable process during an operation of fabricating the p-doped semiconductor layer, so that layer doping differs as the layer thickness increases. The dopant concentration may run, for example, from 0% on the side facing away from the interface and/or interlayer to 100% on the side facing toward the interface and/or interlayer. In that case, at the interface/interlayer, a thin film of dopant is conceivable. It is additionally conceivable for different dopants to be incorporated in the p-doped semiconductor layer, with a consequent variation in the conductivity, or a consequent suitable design of the potential barrier.

In various embodiments the optoelectronic component has a layer stack comprising the organic layer structure. This layer stack may have at least one active layer. The active layer comprises, for example, an electroluminescent material. The optoelectronic component is therefore configured as a radiation-emitting device. In various embodiments the organic layer structure is disposed between a first active layer and a second active layer. The organic layer structure has the function in particular of providing intrinsic charge carriers to the active layers. In various embodiments the organic layer structure is applied on an electrode, more particularly, on an anode contact. In this case the organic layer structure advantageously supports passage of positive charge carriers from the anode material into organic semiconductor layers.

BRIEF DESCRIPTION OF THE DRAWINGS

Various working examples of the optoelectronic component are elucidated in more detail below by means of the drawings. In the figures, the first digit or digits of a reference symbol indicate the figure in which the reference symbol is first used. The same reference symbols are used for properties or elements of the same kind or same effect across all figures. In the figures.

DETAILED DESCRIPTION OF ILLUSTRATIVE EMBODIMENTS

Charge Generation Layer Sequence

Figure 1A:
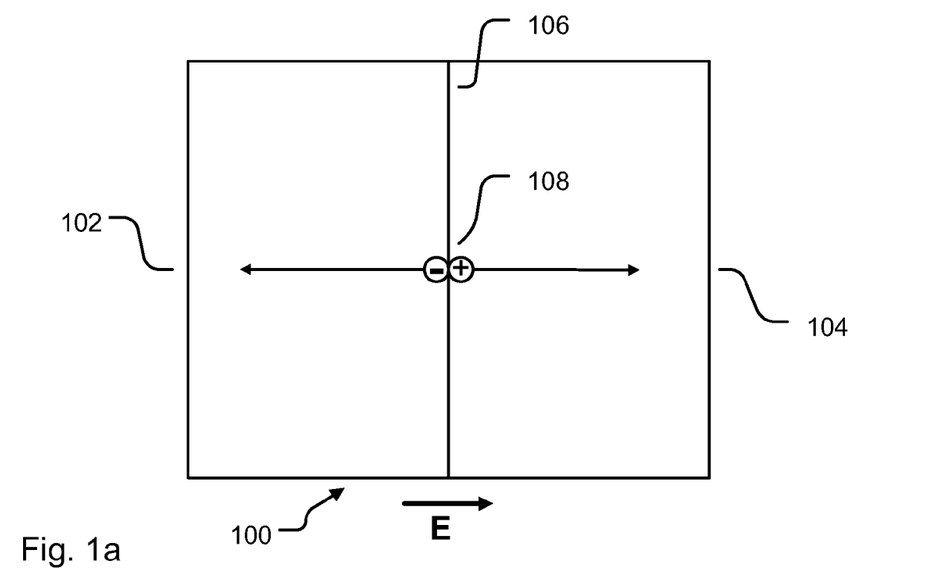
FIG. 1a shows a diagrammatic representation of a first working example of a charge generation layer.
Figure 1B:
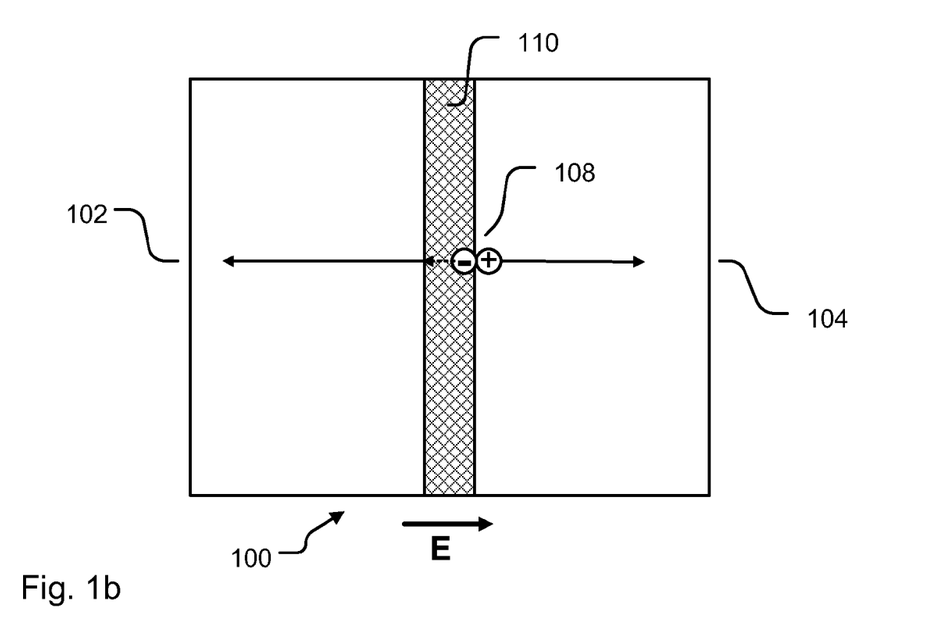
FIG. 1b shows a diagrammatic representation of a second working example of a charge generation layer.

FIG. 1a and FIG. 1b show a diagrammatic representation of first and second working examples, respectively, of a charge generation layer sequence 100.

In different configurations, the charge generation layer sequence 100 features a layer sequence of doped organic and inorganic semiconductor materials. In the first working example, shown in FIG. 1a, the charge generation layer sequence 100 is configured as a layer sequence of an n-doped first organic semiconductor layer 102 and a p-doped second organic semiconductor layer 104. Formed between the first organic semiconductor layer 102 and the second organic semiconductor layer 104 is an interface 106.

At the interface 106 of the n-doped first organic semiconductor layer 102 and the p-doped second organic semiconductor layer 104, with application of an electric field E, a depletion zone is formed. As a result of quantum fluctuations, a charge carrier pair 108 may come about spontaneously at the interface 106. The charge carrier pair 108 comprises charge carriers of different charge carrier type, such as an electron and a hole, for instance. The electron is able, by means of a tunnel process, to cross the potential barrier of the interface 106, from the p-doped second organic semiconductor layer 104, and so to occupy a free state in the n-doped semiconductor layer 102. In the p-doped second semiconductor layer 104, an unoccupied state initially remains, in the form of the hole. This fluctuation can therefore be described by the spontaneous formation at the interface 106 of a charge carrier pair 108 with charge carriers of different charge carrier type. A tunnel process separates the charge carriers. Under the action of the electrical field E, the charge carriers migrate in the direction of the anode or cathode, depending on charge carrier type. Recombination of the charge carriers is therefore prevented by the transport of charge carriers to the electrodes that is brought about by the electrical field E.

In the second working example, shown in FIG. 1b, a suitable interlayer 110 is disposed as a potential barrier between the first organic semiconductor layer 102 and the second organic semiconductor layer. The interlayer 110 features a material such as CuPc (copper phthalocyanine), for example. By means of the interlayer 110 it is possible to stabilize the charge generation layer sequence 100 in terms of dielectric strength. Moreover, the interlayer 110 is able to prevent diffusion of dopants from one organic semiconductor layer into the other, or to prevent a chemical reaction occurring between the two organic semiconductor layers and/or their dopants. Lastly, by means of the interlayer 110, it is possible to design the potential barrier, more particularly the width of the potential barrier, between the n-doped organic semiconductor layer 102 and the p-doped organic semiconductor layer 104. It is therefore possible, for example, to influence the strength of a tunnel current forming as a result of quantum fluctuations.

Energy Levels in the Charge Generation Layer Sequence

Figure 2A:
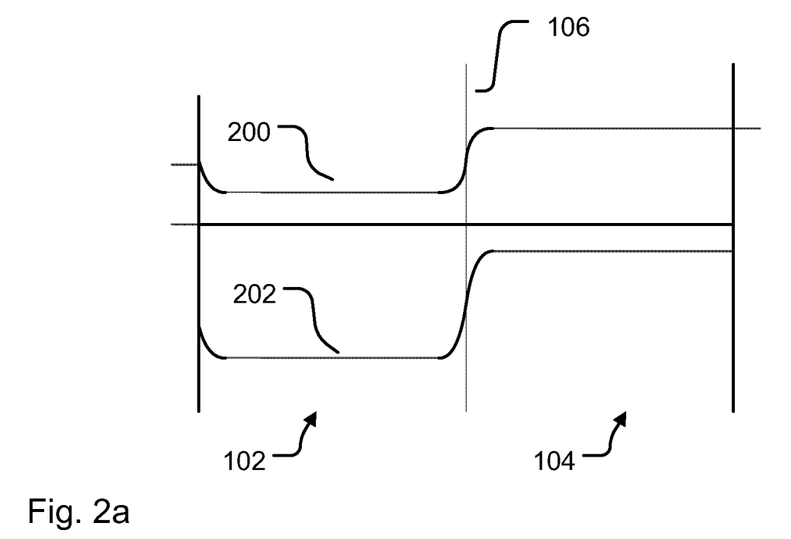
FIG. 2a shows a diagrammatic representation of the energy levels in a charge generation layer sequence without applied voltage.

FIG. 2a shows a diagrammatic representation of the energy levels in the charge generation layer sequence 100 without applied voltage. The charge generation layer sequence 100 features an n-doped first organic semiconductor layer 102 and a p-doped second organic semiconductor layer 104. Charge transport within organic semiconductors occurs substantially by hopping processes from a localized state to an adjacent, likewise localized state. Shown in FIG. 2a are the energy levels in the first organic semiconductor layer 102 and in the second organic semiconductor layer 104. Indicated in each case are the lowest unoccupied molecular orbital (LUMO) energy level 200 and the highest occupied molecular orbital (HOMO) energy level 202 of the first organic semiconductor layer 102 and of the second organic semiconductor layer 104. The LUMO energy level 200 is comparable with the conduction band of an inorganic semiconductor and indicates the energy range in which electrons have a very high mobility. The HOMO energy level 202 is comparable with the valence band of an inorganic semiconductor and indicates the energy range in which holes have a very high mobility. Formed between the LUMO energy level and the HOMO energy level is an energy gap, which would correspond to a band gap in an inorganic semiconductor.

The first organic semiconductor layer 102 is n-doped, while the second organic semiconductor layer 104 is p-doped. Correspondingly, the first organic semiconductor layer 102 has a lower LUMO energy level and a lower HOMO energy level than the second organic semiconductor layer 104. At the interface 106, the energy levels undergo continuous transition into one another as a result of free charge carriers or possible dipole formation. Band bending occurs at the interface 106.

Figure 2B:
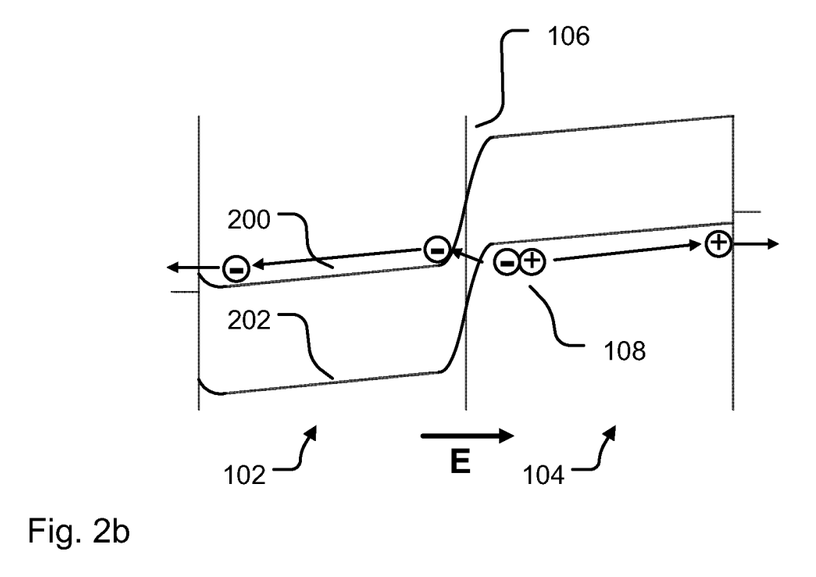
FIG. 2b shows a diagrammatic representation of the energy levels in the charge generation layer sequence with applied reverse voltage.

FIG. 2b shows a diagrammatic representation of the energy levels in the charge generation layer sequence 100 in the case of an applied reverse voltage. The reverse voltage is associated with an electrical field E. Owing to the reverse voltage, the energy levels are shifted in the organic semiconductor layers, being inclined owing to the voltage drop over the charge generation layer sequence 100. Produced accordingly at the interface 106 is a region within which the LUMO energy level 200 of the first organic semiconductor layer 102 adopts values similar to those of the HOMO energy level 202 of the second organic semiconductor layer 104. Quantum fluctuations allow a charge carrier pair 108 to form at the interface 106 in the HOMO energy level 202 of the second organic semiconductor layer 104. The charge carrier pair 108 consists of an electron and a hole. As a result of the band bending at the interface 106, the electron is able with a relatively high probability, in a tunnel process, to cross the potential barrier at the interface 106 and to occupy a free state in the LUMO energy level 200 of the n-doped first organic semiconductor layer 102.

The hole which remains is transported by the electrical field E away from the boundary layer 106 and out of the second organic semiconductor layer 104. As a result of the falling LUMO energy level 200, the electron in the first organic semiconductor layer is transported away from the boundary layer. As a result, when a reverse voltage is applied, additional free charge carriers are provided as a result of intrinsic excitations at the charge generation layer sequence 100.

It is conceivable for a suitable interlayer 110 to be disposed as a potential barrier between the first organic semiconductor layer 102 and the second organic semiconductor layer, for the purpose of increasing or configuring the tunnel current. The interlayer 110 features a material such as CuPc (copper phthalocyanine), for example. With the aid of the interlayer 110, the charge generation layer sequence 100 can be stabilized in terms of dielectric strength. Furthermore, by means of the interlayer, it is possible to prevent diffusion of dopants from one organic semiconductor layer into the other, or to prevent a chemical reaction between the two organic semiconductor layers and/or their dopants. Lastly, by means of the interlayer, it is possible to design the potential barrier, more particularly the width of the potential barrier, between the n-doped organic semiconductor layer 102 and the p-doped organic semiconductor layer 104. In this way, for example, it is possible to influence the strength of a tunnel current formed as a result of quantum fluctuations.

On account of the described function of the charge generation layer sequence 100, it may also be termed an organic layer for separating charge carriers, or a CGL. Studies of the charge generation layer sequence 100 are known, for example, from document Kröger, M., et al., "Temperature-independent field induced charge separation of doped organic/organic interfaces: Experimental modeling of electrical properties," Phys. Rev. B 75, 235321 (2007), and from document Meerheim, R., et al., "Ultrastable and efficient red organic light emitting diodes with doped transport layers," Appl. Phys. Lett. 89, 061111 (2006), which are hereby incorporated by reference into the disclosure content of the present application.

The first organic semiconductor layer 102 is n-doped. For the n-doping it is possible to use metals with low exit energy, examples being cesium, lithium, or magnesium. Likewise suitable as n-dopant are compounds which comprise these metals, as for example $Cs_2CO_3$, CsF, or LiF. These dopants are incorporated in a matrix material. An example of a suitable matrix material is TPBi (1,3,5-tris(1-phenyl-1H-benzimidazol-2-yl)benzene). The second organic semiconductor layer 104 is p-doped with a copper complex. In this case it is possible for the following materials to be used as part of the matrix material:

NPB (N,N'-bis(1-naphthyl)-N,N'-bis(phenyl)benzidine, β-NPB (N,N'-bis(naphthalen-2-yl)-N,N'-bis(phenyl)benzidine), TPD (N,N'-bis(3-methylphenyl)-N,N'-bis(phenyl) benzidine), N,N'-bis(1-naphthyl)-N,N'-bis(phenyl)-2,2-dimethylbenzidine, spiro-TPD (N,N'-bis(3-methylphenyl)-N,N'-bis(phenyl)-9,9-spirobifluorene), spiro-NPB (N,N'-bis(1-naphthyl)-N,N'-bis(phenyl)-9,9-spirobifluorene), DMFL-TPD (N,N'-bis(3-methylphenyl)-N,N'-bis(phenyl)-9,9-dimethylfluorene, DMFL-NPB (N,N'-bis(1-naphthyl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphth-1-yl)-N,N'-bis(phenyl)-9,9-diphenylfluorene), Sp-TAD (2,2',7,7'-tetrakis(n,n-diphenylamino)-9,9'-spirobifluorene), TAPC (di[4-(N,N-ditolylamino)phenyl]cyclohexane), spiro-TTB (2,2',7,7'-tetra(N,N-ditolyl)amino-spiro-bifluorene), BPAPF (9,9-bis[4-(N,N-bis-biphenyl-4-yl-amino)phenyl]-9H-fluorene), spiro-2NPB (2,2',7,7'-tetrakis[N-naphthyl(phenyl)-amino]-9,9-spirobifluorene), spiro-5 (2,7-bis[N,N-bis(9,9-spirobifluoren-2-yl)amino]-9,9-spirobifluorene), 2,2'-spiro-DBP (2,2'-bis[N,N-bis(biphenyl-4-yl)amino]-9,9-spirobifluorene), PAPB (N,N'-bis(phenanthren-9-yl)-N,N'-bis(phenyl)benzidine), TNB (N,N,N',N'-tetranaphthalen-2-yl-benzidine), Spiro-BPA (2,2'-bis(N,N-diphenylamino)-9,9-spirobifluorene), NPAPF (9,9-bis[4-(N,N-bis-naphthylamino)phenyl]-9H-fluorene), NPBAPF (9,9-bis[4-(N,N'-bis-naphth-2-yl-N,N'-bis-phenylamino)phenyl]-9H-fluorene), TiOPC (titanium oxide-phthalocyanine), CuPC (copper phthalocyanine), F4-TCNQ (2,3,5,6-tetrafluoro-7,7,8,8,-tetracyanoquinodimethane), m-MTDATA (4,4',4''-tris(N-3-methylphenyl-N-phenylamino)triphenylamine), 2T-NATA (4,4',4''-tris(N-(naphthalen-2-yl)-N-phenyl-amino)triphenylamine), 1-TNATA (4,4',4''-tris(N-(1-naphthyl)-N-phenylamino)triphenylamine), NATA (4,4',4''-tris(N,N-diphenylamino)triphenylamine), PPDN (pyrazino[2,3-f][1,10]phenanthroline-2,3-dicarbonitrile), MeO-TPD (N,N,N',N'-tetrakis(4-methoxy-phenyl)benzidine), MeO-spiro-TPD (2,7-bis[N,N-bis(4-methoxyphenyl)amino]-9,9-spirobifluorene), 2,2'-MeO-spiro-TPD (2,2'-bis[N,N-bis(4-methoxyphenyl)amino]-9,9-spirobifluorene), β-NPP (N,N'-di(naphthalen-2-yl)-N,N'-diphenylbenzene-1,4-diamine), NTNPB (N,N'-diphenyl-N,N-di-[4-(N,N-ditolylamino)phenyl]benzidine), or NPNPB (N,N'-diphenyl-N,N'-di[4-(N,N-diphenylamino)phenyl]benzidine).

Serving as p-dopant is a copper complex with at least one ligand with the chemical structure according to formula I:

(I)

$E_1$ and $E_2$ are in each case independently of one another one of the following elements: oxygen, sulfur, or selenium. R is selected from the following group: hydrogen, or substituted or unsubstituted, branched, linear, or cyclic hydrocarbons.

The abovementioned copper complex, in relation to the matrix material of the second organic semiconductor layer 104, is a metal-organic acceptor assembly. It serves as a p-dopant. The copper complex here may be an isolated molecule. The copper complex is frequently joined by chemical bonds to molecules of the matrix material—for example, by molecules of the matrix material, as ligands, forming part of the copper complex. The copper atom typically complexes with organic ligands. The organic ligands may form suitable functional groups, thus permitting joining to an oligomer or a polymer.

The copper complex may have a unidentate, tridentate, or tetradentate ligand. More particularly the complex may comprise one or more groups $C(=E_1)E_2$, with at least one, or two or more, of the donor atoms $E_1$ and $E_2$ of the ligands, and the copper atoms, undergoing complexation. The $C(=E_1)E_2$ group here typically has a negative charge. Undeprotonated carboxylic acids or homologs thereof may also serve as ligands of the copper complex. The ligand of the copper complex generally contributes negative charge to the complex, by means, for example, of one negative charge per carboxyl group or per homologous carboxyl group.

Where no molecules of the matrix material join to the copper atoms, the copper complex is a homoleptic complex, in which solely ligands undergo complexation with the central copper atom. A complex of this kind often has a rectangular or linear molecular geometry. This is so especially if interactions between copper atoms are negligible. Where molecules from the matrix material join to the central copper atom, the molecular geometry of the complex adopts the form of a pentagonal bipyramid, or the complex acquires a square-pyramidal molecular geometry. This copper complex is commonly an electrically neutral complex.

The copper complex may be either a mononuclear copper complex or a polynuclear copper complex. In a polynuclear copper complex, the ligand may be joined only to one copper atom or to two copper atoms. In that case the ligand, for example, may form a bridge between two copper atoms. If the ligand is intended to be tridentate or polydentate, it may also join more copper atoms as a bridge. In the case of a polynuclear copper complex, there may be copper-copper connections between two or more copper atoms. The use of polynuclear copper complexes is especially advantageous because an organic functional layer with this kind of doping has a longer lifetime than a functional layer doped with a mononuclear copper complex. This can be explained by destabilization of the complex in the event of charge transport through the functional layer. In the case of polynuclear copper complexes, the effect of charge transport is distributed not only over one copper complex but instead over two or more copper complexes.

A polynuclear copper complex may have what is called a "paddle wheel" structure. This is especially the case when the complex is a copper(II) complex. A paddle wheel structure is typically assumed in a complex with two metal atoms, in which two copper atoms are joined by one or more polydentate ligands as bridge.

The coordination mode of all of the ligands with respect to the copper atom is frequently almost identical. Consequently, with regard to the copper atoms and the ligands, at least one bidentate or tetradentate axis of rotation is defined by two of the copper atoms in the polynuclear copper complex. Square-planar complexes here often have an at least tetradentate axis of rotation, while linearly coordinated complexes frequently have a bidentate axis of rotation.

The copper atom of a mononuclear complex or at least one copper atom of a polynuclear copper complex may have a +2 oxidation state. In such complexes the ligands are frequently coordinated in a square-planar geometry. If the copper atom has a +1 oxidation state, the copper atom is frequently linearly coordinated.

Copper complexes with a Cu(II) atom, as a general rule, have a higher hole conductivity than copper complexes with a Cu(I) atom. The latter have a closed-off $d^{10}$ shell. Hole conductivity is caused primarily by the Lewis acid that forms as a result of the Cu(I) atoms. Cu(II) complexes, in contrast, have an unfilled $d^9$ configuration, thereby giving rise to oxidation behavior. Partial oxidation raises the hole density. The use of Cu(I) complexes, however, can be advantageous, since Cu(I) complexes are frequently more stable thermally than are corresponding Cu(II) complexes.

A feature shared by the copper complexes described is that they are a Lewis acid. A Lewis acid is a compound that acts as an electron pair acceptor. The behavior of the copper complexes as a Lewis acid is linked with the molecules of the matrix material in which the copper complex is incorporated as dopant. The molecules of the matrix material generally act as a Lewis base in relation to the Lewis-acidic copper molecules. A Lewis base is an electron pair donor.

The copper atom in the copper complex possesses one open, i.e., further coordination site. A Lewis-basic compound is able to bind to this coordination site—for example, an aromatic ring system, a nitrogen atom or an amine component, present in the matrix material. This is shown by way of example in diagrams 1 and 2:

adamantyl, cyclohexyl, or partly or fully substituted alkyl groups. The substituted or unsubstituted aromatic groups are, for example, phenyl, biphenyl, naphthyl, phenanthryl, benzyl, or a heteroaromatic radical, as for example a substituted or unsubstituted radical, which may be selected from the heterocycles of diagram 3:

Diagram 3

Furane  Thiophen  Pyrrol  Oxazol  Thiazol  Imidazol

Diagram 1

Diagram 2

It is also possible for groups with heteroaromatic ring systems, or a nitrogen atom of an amine component, to coordinate with a copper atom.

The ligand which coordinates to the copper atom may have a group R which features a substituted or unsubstituted hydrocarbon group. The hydrocarbon group may be a linear, branched, or cyclic group. This group may have 1-20 carbons. It is, for example, a methyl or ethyl group. It may also feature fused substituents, such as decahydronaphthyl, -continued Isoxazol  Isothiazol  Pyrazol  Pyridin  Pyrazin  Pyrimidin Bipyridin & Derivate (0-2X/Ring = N)

The ligand which coordinates to the copper atom may also have a group R which comprises an alkyl group and/or an aryl group. The alkyl group and/or aryl group comprises at least one electron-withdrawing substituent. The copper complex may likewise, as a mixed system, comprise one or more types of a carboxylic acid.

An electron-withdrawing substituent is understood in the present disclosure to be a substituent which lowers the electron density in an atom bonded to the substituent, relative to a configuration in which a hydrogen atom, rather than the electron-withdrawing substituent, bonds to the atom.

An electron-withdrawing group may be selected, for example, from the following group: halogens, such as chlorine or more particularly fluorine, nitro groups, cyano groups, or mixtures of these groups. The alkyl or aryl group may comprise exclusively electron-withdrawing substituents, such as the stated electron-withdrawing groups, or hydrogen atoms.

If the ligand has an alkyl and/or aryl group with at least one electron-withdrawing substituent, the electron density at the copper atom or atoms is reduced, thereby increasing the Lewis acidity of the complex.

The ligand here may represent an anion of the carbonic acids $CHal_xH_{3-x}COOH$, more particularly $CF_xH_{3-x}COOH$ and $CCl_xH_{3-x}COOH$, where Hal is a halogen atom and x is an integer from 0 to 3. The ligand may also be an anion of the carbonic acids $CR'_yHal_xH_{3-x-y}COOH$, where Hal is a halogen atom, x is an integer from 0 to 3 and y is an integer having a value of at least 1. The residue group R' is an alkyl group, a hydrogen atom, or an aromatic group, such as, for example, a phenyl group, or any of the substituent groups described hitherto. It may comprise electron-withdrawing substituents, more particularly the electron-withdrawing substituents described earlier on above. It may also comprise a derivative of benzoic acid with an electron-withdrawing substituent. For example, the ligand may be an anion of the carbonic acid $R'—(CF_2)_n—CO_2H$, where n adopts an integral value of between 1 and 20. For example, a fluorinated, more particularly a perfluorinated, homoaromatic or heteroaromatic compound may be used as the residue group. One example is anions of a fluorinated benzoic acid:

where x adopts an integral value from 1 to 5. More particularly, it is possible for the following substituents, or those in which fluorine has been replaced by chlorine, to bond to the carboxyl group, all of which are strong Lewis acids:

$CF_3$   $(3-F)C_6H_4$   $(3,5-F)_2C_6H_3$   $(2,3,4-F)_3C_6H_2$

C<sub>6</sub>F<sub>5</sub>    (2,4,6-CF<sub>3</sub>)<sub>3</sub>C<sub>6</sub>H<sub>3</sub>

(2,6-CF<sub>3</sub>)<sub>2</sub>C<sub>6</sub>H<sub>3</sub>    (3,5-CF<sub>3</sub>)<sub>2</sub>C<sub>6</sub>H<sub>3</sub>

It is possible, furthermore, for anions of the following acid to be used as ligands:

where X may be a nitrogen or a carbon atom which bonds, for example, to a hydrogen atom or to a fluorine atom. By way of example, it is possible for three of the atoms X to be a nitrogen atom and for two to be a C—F bond or C—H bond (in the form of triazine derivatives). Anions of the following acid as well may be used as ligands:

where the naphthyl ring is substituted by 1 to 7 fluorine substituents, and so y=0-4 and x=0-3, with y+x=1-7.

Fluorine and compounds of fluorine as electron-withdrawing substituents are especially advantageous since copper complexes which contain fluorine atoms, in the context of production of the optoelectronic component, can be easily vaporized and deposited in an organic layer. As a further or alternative substituent group, mention may be made of a trifluoromethyl group.

First Working Example of the Optoelectronic Component

Figure 3:
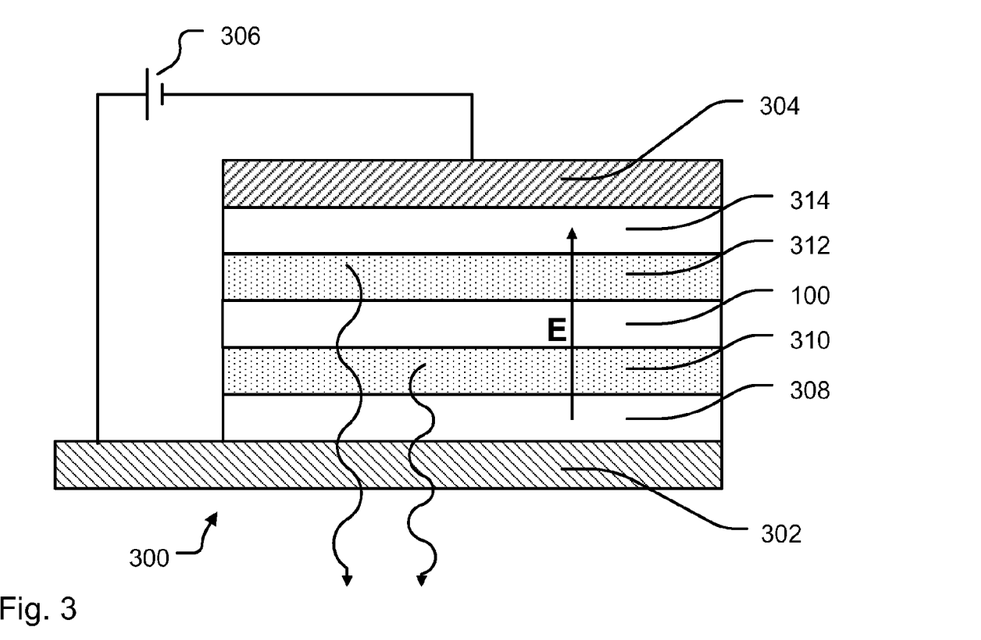
FIG. 3 shows a diagrammatic representation of a first working example of an optoelectronic component.

FIG. 3 shows the diagrammatic representation of a first working example of an optoelectronic component having a charge generation layer sequence. The optoelectronic component 300 has an anode 302 and a cathode 304. The anode 302 and the cathode 304 serve as electrodes of the optoelectronic component 300. They are connected to an external current source 306—for example, to a primary battery or to a rechargeable battery. Disposed between the anode 302 and the cathode 304 is a layer stack of organic and/or inorganic semiconductor materials. The anode 302 and the cathode 304 each feature a highly conductive material, which may be selected for its optical properties. By way of example, the anode 302 and/or the cathode 304 may consist of a transparent material comprising a metal oxide, such as an indium tin oxide (or ITO), and/or a transparent, conductive polymer. It is also possible for at least one of the anode 302 and the cathode 304 to consist of a highly conductive, reflecting material, which comprises, for example, a metal, for instance aluminum, silver, platinum, copper, or gold, or a metal alloy.

Via the anode 302, positive charge carriers (holes) are injected into the layer stack, whereas negative charge carriers (electrons) are injected into the layer stack by the cathode 304. At the same time there is an electrical field E between the anode 302 and the cathode 304. The effect of the electrical field E is that holes injected from the anode 302 migrate through the layer stack in the direction of the cathode 304. Under the influence of the electrical field E, electrons injected from the cathode 304 migrate in the direction of the anode 302.

The layer stack features a series of different functional layers. Applied directly on the anode 302 is a hole-transporting layer 308. Applied on the hole-transporting layer 308 is a first active layer 310. The hole-transporting layer 308 serves for transport of holes injected from the anode 302 into the first active layer 310. It may have, for example, a p-doped conductive organic or inorganic material. For the p-doping it is possible to use any suitable material. Serving, for example, as p-dopant is a copper complex with at least one ligand with the chemical structure according to formula I:

$E_1$ and $E_2$ are in each case independently of one another one of the following elements: oxygen, sulfur, or selenium. R is selected from the following group: hydrogen, or substituted or unsubstituted, branched, linear, or cyclic hydrocarbons.

Since charge carrier transport in organic semiconductors occurs not in the conduction band but instead, for example, by means of hopping or tunnel processes, the mobilities of holes and electrons differ considerably. So that excitons are formed not in the anode 302 but instead, in particular, in the first active layer 310, it is also possible for an electron transport-blocking layer to be provided between anode 302 and the first active layer 310.

The layer stack also has a second active layer 312, which is separated from the first active layer 310 by a charge generation layer sequence 100. The second active layer 312 is covered by an electron-transporting layer 314 and the cathode 304 disposed over it. The electron-transporting layer 314 serves for transport of electrons injected from the cathode 304 into a second active layer 312. It may comprise, for example, an n-doped conductive organic or inorganic material.

The charge generation layer sequence 100 serves for provision of additional charge carriers, by injecting holes in the direction of the cathode 304 and electrons in the direction of the anode 302. Between the charge generation layer sequence 100 and the anode 302, therefore, more charge carriers are available to the first active layer 310. The second active layer 312, as well, is provided with more charge carriers. The voltage drop across the layer stack is thereby reduced. A consequence of this is that even at low voltages, i.e., with low electrical fields in the layer stack, it is possible for comparatively high currents to flow. Taking an OLED as an example, the associated advantage becomes clear.

In the OLED example, both the first active layer 310 and the second active layer 312 are light-emitting layers. For this purpose, the first active layer 310 and the second active layer 312 each feature an organic electroluminescent material by means of which the formation of excitons from charge carriers, and subsequent decomposition with emission of electromagnetic radiation, is brought about. The selection of the electroluminescent material is a sector which is experiencing continual ongoing development. Examples of such organic electroluminescent materials include the following:
   (i) Poly(p-phenylenevinylene) and its derivatives substituted at different positions on the phenylene group;
   (ii) Poly(p-phenylenevinylene) and its derivatives substituted at different positions on the vinylene group;
   (iii) Poly(p-phenylenevinylene) and its derivatives substituted at different positions on the phenylene component and also at different positions on the vinylene group;
   (iv) Polyarylenevinylene, where the arylene may comprise groups such as, for instance, naphthalene, anthracene, furylene, thienylene, oxadiazole, and the like;
   (v) Derivatives of polyarylenevinylene, where the arylene may be as in (iv) above and may additionally have substituents at different positions on the arylene;
   (vi) Derivatives of polyarylenevinylene, where the arylene may be as in (iv) above and may additionally have substituents at different positions on the vinylene;
   (vii) Derivatives of polyarylenevinylene, where the arylene may be as in (iv) above and may additionally have substituents at different positions on the arylene and substituents at different positions on the vinylene;
   (viii) Copolymers of arylene-vinylene oligomers such as, for instance, those in (iv), (v), (vi), and (vii) with nonconjugated oligomers; and
   (ix) Poly(p-phenylene) and its derivatives substituted at different positions on the phenylene groups, including ladder polymer derivatives such as, for instance, poly (9,9-dialkylfluorene) and the like;
   (x) Polyarylenes, where the arylene may comprise groups such as naphthalene, anthracene, furylene, thienylene, oxadiazole, and the like; and their derivatives substituted at different positions on the arylene group;
   (xi) Copolymers of oligoarylenes such as, for instance, those in (x) with nonconjugated oligomers;
   (xii) Polyquinoline and its derivatives;
   (xiii) Copolymers of polyquinoline with p phenylene, substituted on the phenylene by, for example, alkyl groups or alkoxy groups, in order to acquire solubility; and
   (xiv) Rigid rod polymers such as, for instance, poly(p-phenylene-2,6-benzobisthiazole), poly(p-phenylene-2,6-benzobisoxazole), poly(p-phenylene-2,6-benzimidazole), and their derivatives.

Other organic emitting polymers such as, for instance, those which use polyfluorene include polymers which emit green, red, blue, or white light, or their families, copolymers, derivatives, or mixtures thereof. Other polymers include polyspirofluorene-like polymers.

Alternatively, instead of polymers, it is possible for small organic molecules which emit via fluorescence or via phosphorescence to serve as the organic electroluminescent layer.

Examples of small-molecule organic electroluminescent materials include the following:
(i) Tris(8-hydroxyquinolinato)aluminum, (Alq);
(ii) 1,3-Bis(N,N-dimethylaminophenyl)-1,3,4-oxidazole (OXD-8);
(iii) -Oxo-bis(2-methyl-8-quinolinato)aluminum;
(iv) Bis(2-methyl-8-hydroxyquinolinato)aluminum;
(v) Bis(hydroxybenzoquinolinato)beryllium (BeQ.sub.2);
(vi) Bis(diphenylvinyl)biphenylene (DPVBI); and
(vii) Arylamine-substituted distyrylarylene (DSA amine).

The first active layer 310 and the second active layer 312 may each be a white-emitting layer. This means that both the first active layer 310 and the second active layer 312 emit electromagnetic radiation in the entire visible spectrum. As a result of the stacking of two active layers, each of the first active layer 310 and the second active layer 312 needs only a low level of luminous intensity, with the optoelectronic component 300 as a whole nevertheless achieving a high luminous intensity. It is particularly advantageous here that the p-doping of the charge transport layer 100, disposed between the active layers, exhibits a high transparency in the range of visible light. As a consequence, a high light yield from the optoelectronic component is obtained.

The provision of the charge generation layer sequence 100 produces an overall increase in the charge carrier density as a result of the injection of additional charge carriers into the adjacent active layers. Processes such as, for example, the formation or dissociation of charge carrier pairs or excitons are intensified. Since some of the charge carriers are provided in the charge generation layer sequence 100, i.e., in the optoelectronic component 300 itself, the current density achievable at the anode 302 and the cathode 304 is low.

The first active layer 310 and the second active layer 312 may also emit electromagnetic radiation in spectra that are displaced relative to one another. Thus, for example, the first active layer 310 may emit radiation in a blue color spectrum, while the second active layer 312 emits radiation in a green and red color spectrum. Any other desired or suitable division is conceivable here. It is especially advantageous in this context that a division can be made according to different physical and chemical properties of emitter materials. For example, one or more fluorescent emitter materials may be incorporated in the first active layer 310, while one or more phosphorescent emitter materials are incorporated in the second active layer 312. Separation of the emitter materials is achieved simply by the arrangement of the charge generation layer sequence 100. Through the separation of the emission spectra of the two active layers, it is also possible, in particular, to set a desired color point of the optoelectronic component.

The function of the charge generation layer sequence 100 can be described illustratively as being that of joining a plurality of individual OLEDs in the form of the active layers in series. Through the intrinsic provision of charge carriers it is possible for a plurality of photons to be emitted per charge carrier pair injected from the photons. In all embodiments, accordingly, the overall current efficiency, i.e., the ratio of emitted radiation to introduced electrical current (cd/A), of the optoelectronic component 300 is significantly increased. Since a high luminous intensity can be achieved even with small currents in the electrodes, a particularly homogeneous illumination pattern can be achieved in the case of large OLED arrays. Moreover, the low level of power needed results in little heat being given off. The cause of this aspect lies in the stacking of the active layers, which are required to provide only a low luminance. A key aspect here for the stacking of active layers in a layer sequence is that charge carriers are provided sufficiently via the charge generation layer sequence 100 and that the absorption of the radiation emitted in the active layer is largely avoided through the use of the copper complex.

This does not only apply to the field of application of emitter devices, such as the OLEDs. In other working examples of the optoelectronic component 300, at least one of the first active layer 310 and the second active layer 312 may be a detector layer, for example, a photovoltaic layer or a photodetector. In the case of a hybrid system, in which, for example, the first active layer 310 represents an emitting layer and the second active layer 312 represents a detecting layer, it is conceivable for the second active layer 312 to detect electromagnetic radiation within a wavelength range in which no radiation or a small fraction of electromagnetic radiation is emitted by the first active layer 310. It is also conceivable for the second active layer 312, as a detector, to detect radiation specifically within a range of the emission wavelengths of the first active layer 310.

All in all, the construction of an optoelectronic component with a charge generation layer sequence 100 comprising the copper complex offers an opportunity to provide particularly efficient optoelectronic components.

Second Working Example of the Optoelectronic Component

Figure 4:
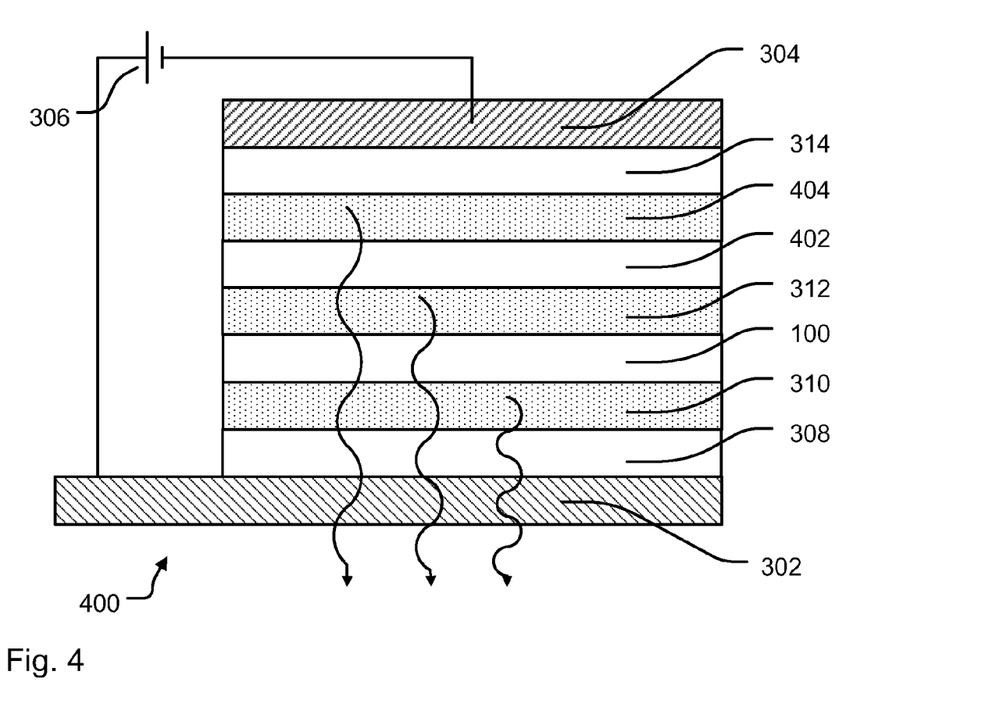
FIG. 4 shows a diagrammatic representation of a second working example of an optoelectronic component.

FIG. 4 shows the diagrammatic representation of a second working example of an optoelectronic component 400. This second working example differs from the first working example of FIG. 3 in the layer sequence between the anode 302 and the cathode 304. The layer stack of the second working example has a second charge generation layer sequence 402 and a third active layer 404, which are disposed between the second active layer 312 and the electron-transporting layer 314.

The optoelectronic component 400 therefore has a stacked structure comprising three active layers. The stacked structure (or stacked device) may also have further stacks comprising a charge generation layer sequence and an active layer. In principle it is conceivable for a structure with as many stacks as desired to be provided. A stacked structure having two active layers is also referred to, for example, as a tandem structure. Similar structures are known, for example, from European Patent Publication No. 1 983 805 A1 or from document Lee, T., et al., "High-efficiency stacked white organic light emitting diodes," Appl. Phys. Lett. 92, 043301 (2008), which are hereby incorporated by reference into the disclosure content of the present application.

The stacked structure is especially suitable for providing an OLED which emits white light. The version with three different stacks, as in the case of the third working example, is particularly advantageous in this context. Thus it is possible, for example, to provide what is called an "RGB emitter," in which one active layer in each case emits a red, a green, or a blue color spectrum. In this way, a precise color point of the spectrum emitted overall can be set. Through the division into three active layers it is possible, for example, for each emitter material used to be incorporated in an optically optimum position within the layer stack. In that case, effects such as absorption of different wavelengths or refractive indices at interfaces may be taken into account.

What has been said above does of course also apply, analogously, to an optoelectronic device 400 in which at least one of the active layers acts as a detector.

Third Working Example of the Optoelectronic Component

Figure 5:
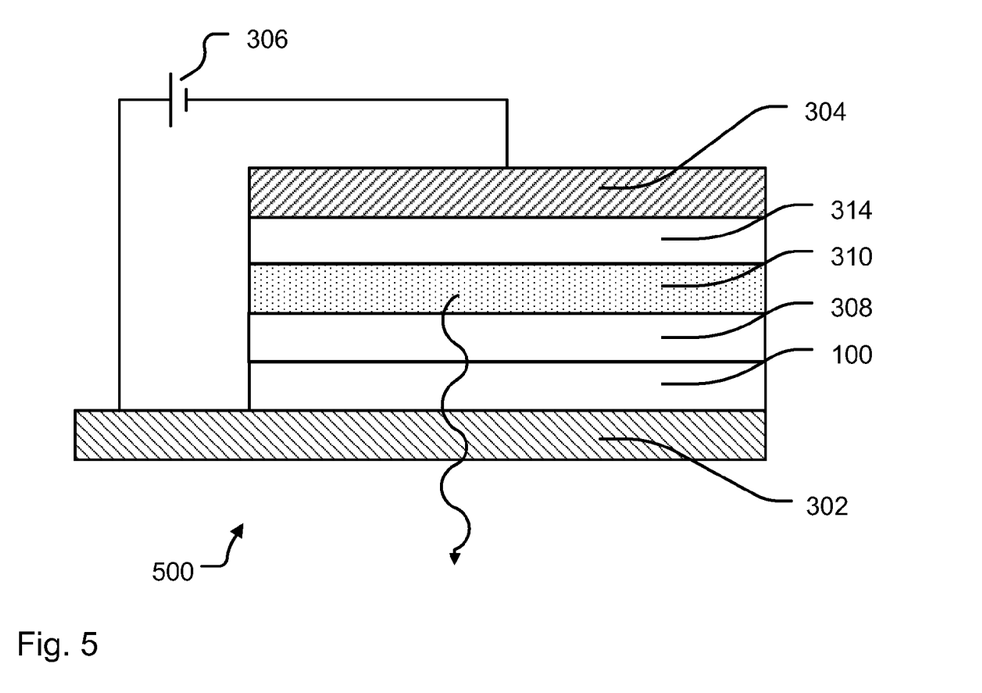
FIG. 5 shows a diagrammatic representation of a third working example of an optoelectronic component.

FIG. 5 shows the diagrammatic representation of a third working example of an optoelectronic component 500 with a charge generation layer sequence 100. The third working example differs from the first working example in that there is only one active layer provided. This layer is disposed between the electron-transporting layer 314 and the hole-transporting layer 308. The charge generation layer sequence 100 is disposed between the anode 302 and the hole-transporting layer 308.

As a result of the disposition of the charge generation layer sequence 100 on the anode 302 it is easier for charge carriers—that is, holes more particularly—to be incorporated into the layer stack. This is particularly suitable for suppressing effects of a work function of the anode material, such effects possibly leading to inhibition of the transport of holes into the layer stack. The charge generation layer sequence 100 thus does not have the effect of providing additional charge carriers in the layer stack. Instead, for example, it supports the entry of charge carriers from metallic electrodes into organic materials of the layer stack. This function of the charge generation layer sequence 100 can also be used in combination with the arrangements of the optoelectronic component of the first or second working example, or in any other embodiments.

CONCLUDING OBSERVATION

For the purpose of illustrating the underlying concept, the optoelectronic component has been described using a number of working examples. These working examples are not confined to particular combinations of features. Although certain features and configurations have been described only in connection with a particular working example or individual working examples, they can each be combined with other features from other working examples. It is also possible for particular configurations or individual features shown in working examples to be omitted or added, provided that the general technical teaching remains realized.

The invention claimed is:

1. An optoelectronic component having an organic layer structure for separating charge carriers of a first charge carrier type and charge carriers of a second charge carrier type,
the organic layer structure comprising a copper complex which has at least one ligand with the chemical structure according to formula I:

(I)

wherein $E_1$ comprises an element selected from the group consisting of oxygen, sulfur and selenium, wherein $E_2$ comprises an element selected from the group consisting of oxygen, sulfur and selenium, wherein R is selected from the group consisting of hydrogen or substituted or unsubstituted, branched, linear, or cyclic hydrocarbons, wherein the organic layer structure comprises an organic semiconductor layer p-doped with the copper complex and an n-doped organic semiconductor layer, and wherein an interlayer is disposed between the p-doped organic semiconductor layer and the n-doped organic semiconductor layer.

2. The optoelectronic component according to claim 1, wherein the copper complex is a copper(I) pentafluorobenzoate.

3. The optoelectronic component according to claim 1, wherein the copper complex is incorporated as dopant in a matrix material.

4. The optoelectronic component according to claim 3, wherein the matrix material comprises 1-TNATA (4,4',4"-tris(N-(1-naphthyl)-N-phenylamino)triphenylamine.

5. The optoelectronic component according to claim 1, wherein the organic layer structure comprises a charge generation layer sequence.

6. The optoelectronic component according to claim 1, where the p-doped organic semiconductor layer has a doping gradient toward the n-doped organic semiconductor layer.

7. The optoelectronic component according to claim 6, where the doping of the p-doped organic semiconductor layer increases toward the n-doped organic semiconductor layer.

8. The optoelectronic component according to claim 7, where the organic layer structure is applied on an electrode.

9. The optoelectronic component according to claim 8, wherein the electrode comprises an anode contact.

10. The optoelectronic component according to claim 1, wherein the optoelectronic component has a layer stack comprising the organic layer structure.

11. The optoelectronic component according to claim 10, where the layer stack comprises an active layer.

12. The optoelectronic component according to claim 11, where the active layer comprises an electroluminescent material.

13. The optoelectronic component according to claim 11, where the organic layer structure is disposed between the active layer and a second active layer.

14. The optoelectronic component according to claim 1, wherein $E_1$ and $E_2$ comprise the same element.

15. The optoelectronic component according to claim 1, wherein $E_1$ and $E_2$ comprise different elements.

16. An optoelectronic component having an organic layer structure for separating charge carriers of a first charge carrier type and charge carriers of a second charge carrier type,
the organic layer structure comprising a copper complex which has at least one ligand with the chemical structure according to formula I:

wherein $E_1$ comprises an element selected from the group consisting of oxygen, sulfur and selenium and $E_2$ comprises an element selected from the group consisting of oxygen, sulfur and selenium and wherein R is selected from the group consisting of hydrogen or substituted or unsubstituted, branched, linear, or cyclic hydrocarbons, wherein the organic layer structure comprises an organic semiconductor layer p-doped with the copper complex and an n-doped organic semiconductor layer, and wherein the p-doped organic semiconductor layer has a doping gradient toward the n-doped organic semiconductor layer.

17. The optoelectronic component according to claim 16, where the doping of the p-doped organic semiconductor layer increases toward the n-doped organic semiconductor layer.

18. The optoelectronic component according to claim 17, where the organic layer structure is applied on an electrode.

19. The optoelectronic component according to claim 18, wherein the electrode comprises an anode contact.

20. An optoelectronic component having an organic layer structure for separating charge carriers of a first charge carrier type and charge carriers of a second charge carrier type,
the organic layer structure comprising a copper complex which has at least one ligand with the chemical structure according to formula I:

wherein $E_1$ comprises an element selected from the group consisting of oxygen, sulfur and selenium and $E_2$ comprises an element selected from the group consisting of oxygen, sulfur and selenium and wherein R is selected from the group consisting of hydrogen or substituted or unsubstituted, branched, linear, or cyclic hydrocarbons, wherein the optoelectronic component has a layer stack comprising the organic layer structure, and wherein the layer stack comprises an active layer.

* * * * *